United States Patent
Singh et al.

(10) Patent No.: US 7,164,312 B1
(45) Date of Patent: Jan. 16, 2007

(54) APPARATUS AND METHOD FOR POP-AND-CLICK SUPPRESSION WITH FAST TURN-ON TIME

(75) Inventors: Raminder Jit Singh, San Jose, CA (US); Ansuya P. Bhatt, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 47 days.

(21) Appl. No.: 10/910,691

(22) Filed: Aug. 2, 2004

(51) Int. Cl.
*H03F 1/02* (2006.01)
(52) U.S. Cl. .................................. 330/9; 381/94.5
(58) Field of Classification Search ............. 381/94.5; 327/554
See application file for complete search history.

(56) References Cited

U.S. PATENT DOCUMENTS

| | | | | |
|---|---|---|---|---|
| 3,795,876 A | * | 3/1974 | Takahashi et al. | 333/14 |
| 4,288,753 A | * | 9/1981 | Babano | 330/51 |
| 4,733,205 A | * | 3/1988 | Hughes | 333/172 |
| 4,739,189 A | * | 4/1988 | Kellogg | 327/555 |
| 5,703,528 A | * | 12/1997 | Nebuloni et al. | 330/51 |
| 2004/0218319 A1 | * | 11/2004 | Sae-Ueng et al. | 361/18 |

OTHER PUBLICATIONS

National Semiconductor Corporation, "Fixed Gain 1 Watt Audio Power Amplifier", LM4820-6, Apr. 2002, pp. 1-18.

\* cited by examiner

*Primary Examiner*—Robert Pascal
*Assistant Examiner*—Alan Wong
(74) *Attorney, Agent, or Firm*—Darby & Darby P.C.; Matthew M. Gaffney

(57) ABSTRACT

A circuit for audio amplification includes an amplifier and a first input resistor. The amplifier is arranged to provide an amplifier output signal that is based, in part, on a capacitively-coupled audio input signal. The capacitively-coupled audio input signal is based, in part, on an input RC value. The input RC value is given by the input capacitance times the input resistance. The input resistance is reduced during the turn-on in order to achieve a fast turn-on time with minimal pop-and-click noise. Also, the input resistance is increased to its normal value after the turn-on so that full audio fidelity is substantially maintained during normal operation.

20 Claims, 3 Drawing Sheets

APPARATUS AND METHOD FOR POP-AND-CLICK SUPPRESSION WITH FAST TURN-ON TIME

FIELD OF THE INVENTION

The invention is related to audio amplifiers, and, in particular, to an apparatus and method for pop-and-click suppression with fast turn-on time.

BACKGROUND OF THE INVENTION

Battery life of portable audio devices may be improved by shutting down the audio amplifier of the portable device when the portable device is not in use, and waking up the audio amplifier only as it is needed. However, if a fast turn-on time is used to turn on the audio amplifier from full shutdown, pop-and-click noise may be caused by the fast turn on.

One solution to this problem is to put the audio device into a sleep/standby or mute mode instead of a full shutdown mode. However, this solution may require extra current to keep all of the major nodes of the device charged. This means that the audio device still consumes extra battery power even though it is not being used. Power consumption in the standby mode becomes significant compared to the power consumption in the active mode if the device remains in standby much longer than it is active, which is typically the case for most portable audio devices.

BRIEF DESCRIPTION OF THE DRAWINGS

Non-limiting and non-exhaustive embodiments of the present invention are described with reference to the following drawings, in which.

DETAILED DESCRIPTION

Figure 1:
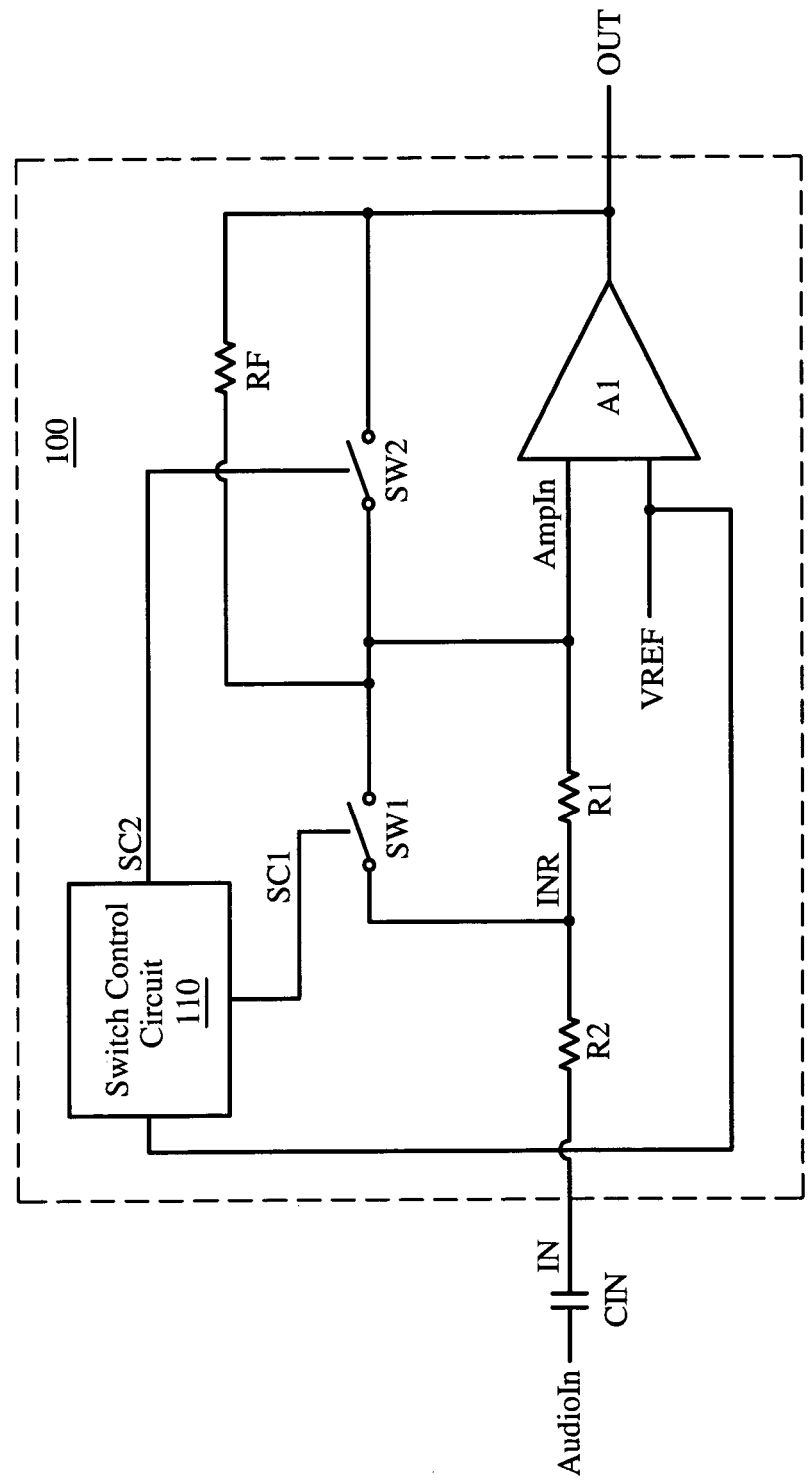
FIG. 1 shows a block diagram of an embodiment of a circuit for audio amplification and an external capacitor.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to a circuit for audio amplification that includes an amplifier and a first input resistor. The amplifier is arranged to provide an amplifier output signal that is based, in part, on a capacitively-coupled audio input signal. The capacitively-coupled audio input signal is based, in part, on an input RC value. The input RC value is given by the input capacitance times the input resistance. The input resistance is reduced during the turn-on in order to achieve a fast turn-on time with minimal pop-and-click noise. Also, the input resistance is increased to its normal value after the turn-on so that full audio fidelity is substantially maintained during normal operation.

FIG. 1 shows a block diagram of an embodiment a circuit for audio amplification 100 and input capacitor CIN. Circuit 100 includes components such as input resistors R1 and R2, feedback resistor RF, switch circuits SW1 and SW2, and switch control circuit 110.

Input capacitor CIN is arranged to provide capacitively-coupled audio input signal IN to circuit 100 from audio input signal AudioIn.

Also, amplifier A1 is arranged to provide amplifier output signal OUT based, in part, on signal IN. Amplifier A1 is arranged to receive amplifier input signal AmpIn at a first amplifier input and reference signal VREF received at a second amplifier output. In one embodiment, the first amplifier input is an inverting input, and the second amplifier input is a noninverting input. When switch circuits SW1 and SW2 are both closed, amplifier A1 operates approximately as a unity gain buffer. When switch circuit SW1 and SW2 are both open, amplifier A1 operates substantially as an inverting amplifier with a gain (OUT/IN) that may be substantially given by −RF/(R1+R2). Signal OUT may be employed to drive a load, such as a speaker, other audio device, and the like. A bridge-tied load configuration, a single-ended configuration, or the like, may be employed to drive the load.

Signal IN may be based, in part, on an input RC value. When switch circuits SW1 and SW2 are both open, the input RC value may be substantially given by CIN*(R1+R2). When switch circuits SW1 and SW2 are both closed, the input RC value may be substantially given by CIN*R2.

Additionally, switch control circuit 110 is arranged to provide switch control signals SC1 and SC2. When amplifier A1 is first enabled, switch circuits SW1 and SW2 are both closed. Also, VREF increases to a final value Thresh (e.g. VDD/2), and signal IN increases based on an RC time constant CIN*R2. At the time that signal VREF reaches Thresh, or a short delay time thereafter, switch circuit SW1 and SW2 both open. Resistor R2 is selected such that, when switch circuits SW1 and SW2 open, signals IN and VREF are substantially the same. This way, pop-and-click noise may be substantially prevented.

Further, R1, R2, and CIN are selected such that, after switch circuits SW1 and SW2 are open, the RC value is sufficiently high that low-frequency signals in signal AudioIn are substantially unattenuated. CIN and R2 are selected such that, when switch circuits SW1 and SW2 are closed, the RC value is sufficiently low that a fast turn-on time is achieved, and that signals IN and VREF are substantially the same when switch circuits SW1 and SW2 are opened.

When switch circuits SW1 and SW2 are both closed, the RC value is relatively small so that a fast turn-on time can be achieved with relatively minimal pop-and-click noise. Pop-and-click noise may result from the difference between signals IN and VREF when switch circuits SW1 and SW2 open. By employing a small RC value while switch circuits SW1 and SW2 are closed, signals IN and VREF both reach Thresh relatively quickly, allowing minimal pop-and-click noise with a fast turn-on time.

When switch circuits SW1 and SW2 are opened, the RC value is increased to prevent low-frequency audio signals from being filtered out, thus substantially maintaining full audio fidelity.

Figure 3:
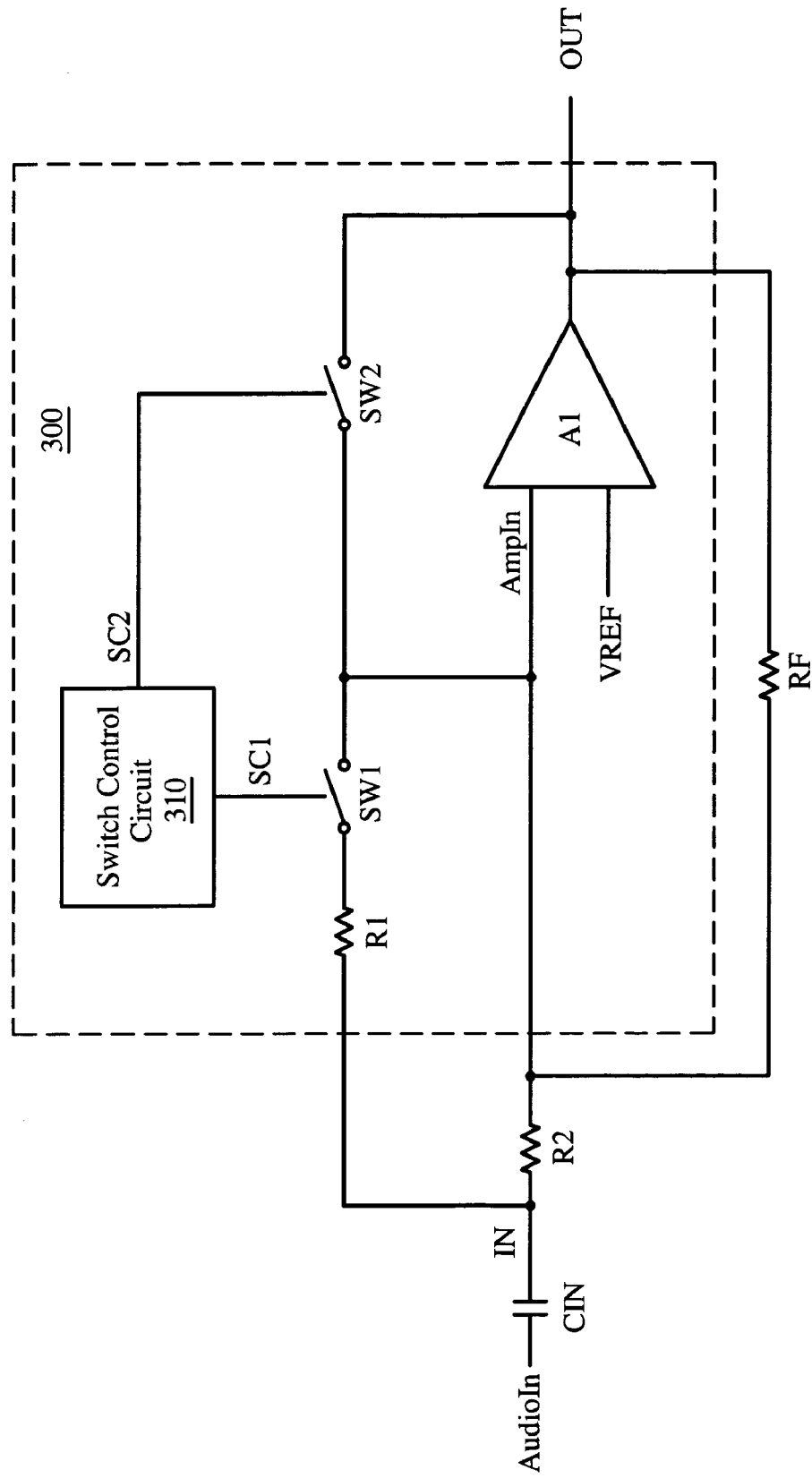
FIG. 3 shows a block diagram of another embodiment of a circuit for audio amplification, which employs external gain resistors and an external capacitor, arranged in accordance with aspects of the invention.

Various components shown in circuit 100 may be external components in other embodiments. FIG. 3 below shows an embodiment in which resistors R2 and RF are external components. Also, signal VREF may be provided internally or externally.

In one embodiment, components in circuit 100 are included in an integrated circuit, and capacitor CIN is external to the integrated circuit.

In one embodiment, circuit 100 employs a single-ended architecture. In another embodiment, circuit 100 is differential. In this embodiment, circuit 100 is arranged to receive a capacitively-coupled differential audio input signal. Also, in this embodiment, signal IN is half of the capacitively-coupled differential audio input signal. The other half (not shown) of the capacitively-coupled differential audio input signal may be processed by amplifier A1, or by another amplifier (not shown) to provide signal OUT as a differential signal.

Figure 2:
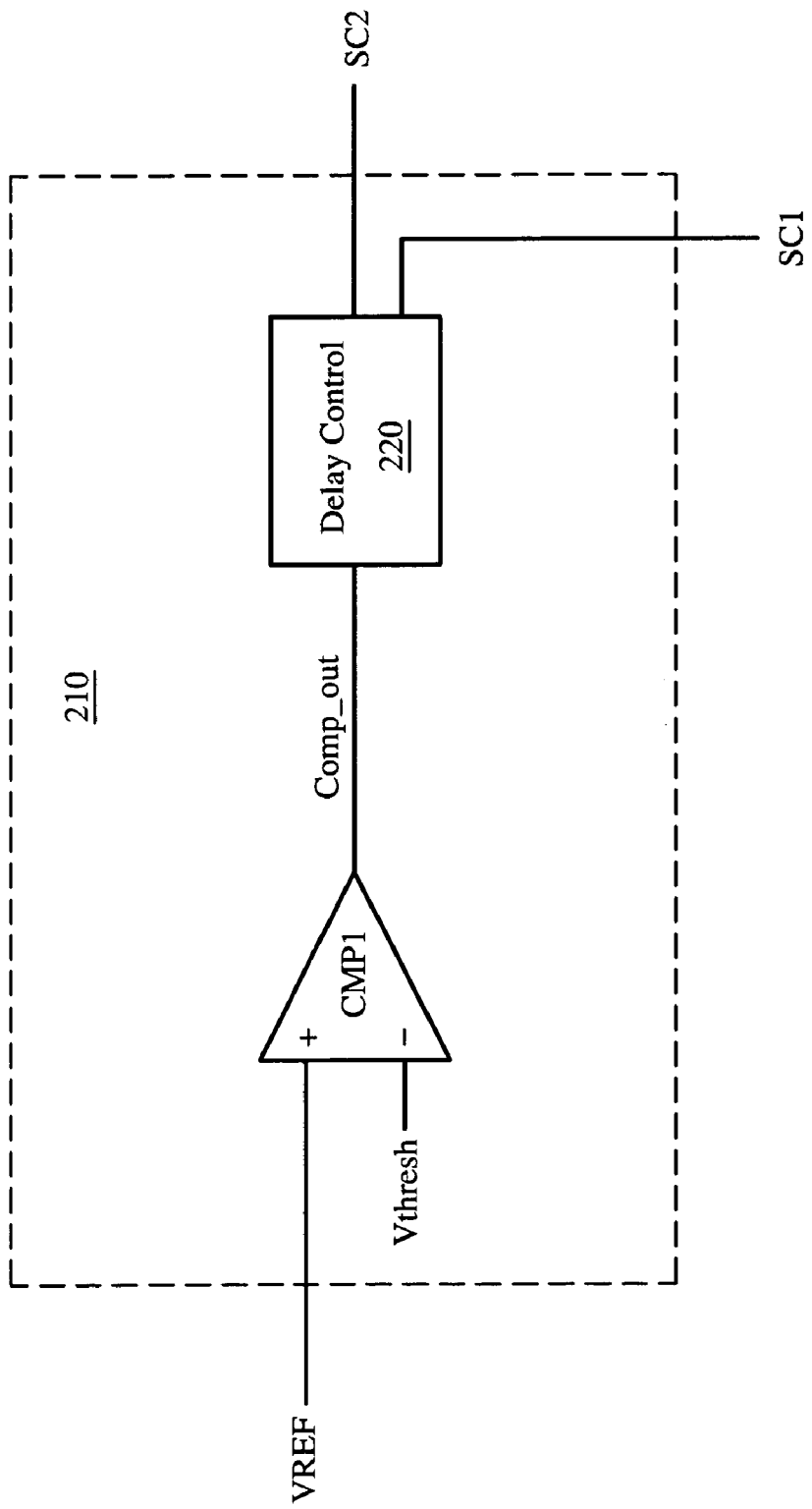
FIG. 2 illustrates a block diagram of an embodiment of the switch control circuit of FIG. 1.

FIG. 2 illustrates a block diagram of an embodiment of switch control circuit 210. Switch control circuit 210 may operate in a substantially similar manner as switch control circuit 110 is FIG. 1, and may operate in a different manner in some ways. Switch control circuit 210 includes components such as comparator circuit CMP1 and delay circuit 220.

Comparator circuit CMP1 is arranged to provide signal Comp out based on a comparison of signal VREF and Vthresh. The voltage of signal Vthresh corresponds to Thresh. In one embodiment, delay circuit 220 is not employed. In this embodiment, signals SC1 and SC2 are provided to open switch circuits SW1 and SW2 as soon as signal VREF reaches signal Vthresh.

In another embodiment, switch control circuit 210 includes delay circuit 220. In this embodiment, signals SC1 and SC2 are provided to open switch circuits SW1 and SW2 after a delay time td occurs after signal VREF reaches signal Vthresh. Signals SC1 and SC2 may be substantially similar signals.

FIG. 3 shows a block diagram of an embodiment of circuit 300 and external components. In the embodiment shown, resistors RF and R2 are external gain resistors. Components in FIG. 3 may operate in a substantially similar manner to similarly-named components in FIG. 1, and may operate in a different manner in some ways.

In operation, when switch circuits SW1 and SW2 is closed, the input RC value may be given by CIN times the parallel combination of R1 and R2 (i.e. CIN*(R1*R2)/(R1+R2)). When switch circuits SW1 and SW2 are open, the input RC value is given by CIN*R2, and the gain (OUT/IN) may be substantially given by RF/R2.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for audio amplification, comprising:
an amplifier including a first amplifier input, a second amplifier input, and an amplifier output, wherein the amplifier is arranged to provide, at the amplifier output, an amplifier output signal based, in part, on a capacitively-coupled audio input signal that is based, in part, on an input RC value;
a first input resistor having a first resistance; and
a first switch circuit that is coupled to the first input resistor and arranged such that the input RC value is based, in part, on the first resistance when the first switch circuit is one of open and closed, and such that the input RC value substantially excludes the first resistance when the first switch circuit is the other of open and closed.

2. The circuit of claim 1, wherein the amplifier is configured to drive a speaker based, in part, on the amplifier output signal.

3. The circuit of claim 1, further comprising a second input resistor having a second resistance, wherein the second input resistor is coupled between an input node and a resistor node, the first input resistor is coupled between the resistor node and the first amplifier input, the first switch circuit is coupled between the resistor node and the first amplifier input, and wherein the second input resistor is arranged to receive the capacitively-coupled audio input signal from an input capacitor having an input capacitance.

4. The circuit of claim 3, wherein the input RC value substantially corresponds to a multiplicative product of the input capacitance and an input resistance; and wherein the input resistance substantially corresponds to a sum of the first resistance and the second resistance when the first switch circuit is open, and substantially corresponds to the second resistance when the first switch circuit is closed.

5. The circuit of claim 1, wherein the first switch circuit and the first input resistor are coupled in series, and wherein the first switch circuit and the first input resistor are coupled between the first amplifier input and an input resistance node.

6. The circuit of claim 5, wherein the first switch circuit and the first input resistor are arranged to receive the capacitively-coupled audio input signal at the input resistance node from an input capacitor having an input capacitance.

7. The circuit of claim 6, wherein
the amplifier is arranged to receive the amplifier input voltage such that the input RC value substantially corresponds to a multiplicative product of the input capacitance and an input resistance; and
wherein the first switch circuit is arranged such that, if the first switch circuit is closed, the input resistance substantially corresponds to a parallel combination of the first resistance and a second resistance that is associated with a second resistor that is coupled between an input node and the input resistance node; and such that if the switch circuit is open, the input resistance substantially corresponds to the second resistance.

8. The circuit of claim 1, further including:
a switch control logic circuit, wherein the switch control logic circuit is arranged to provide a first switch control signal; and wherein the first switch circuit is arranged to close if the first switch control signal corresponds to a first logic level, and arranged to open if the first switch control signal corresponds to a second logic level.

9. The circuit of claim 8, wherein
the amplifier is arranged to receive a reference voltage at the second amplifier input;
when the amplifier is enabled, the reference voltage increases until the reference signal substantially reaches a reference voltage threshold level; and
wherein the switch control logic circuit is arranged to provide the first switch control signal at the second logic level when the reference voltage reaches the reference threshold voltage.

10. The circuit of claim 8, wherein
the amplifier is arranged to receive a reference voltage at the second amplifier input;
when the amplifier is enabled, the reference voltage increases until the reference signal substantially reaches a reference voltage threshold level; and
wherein first switch control circuit is arranged to provide the first switch control signal at the second logic level at a pre-determined amount of delay time after the reference voltage reaches a reference voltage threshold level.

11. The circuit of claim 8, further comprising:
a feedback resistor that is coupled between the first amplifier input and the amplifier output; and
a second switch circuit that is coupled between the first amplifier input and the amplifier output.

12. The circuit of claim 11, wherein the second switch circuit is arranged to open and close responsive to a second switch control signal, wherein the second switch control signal is substantially the same as the first switch control signal.

13. The circuit of claim 8, wherein the switch control logic circuit includes a comparator circuit.

14. The circuit of claim 13, wherein
the amplifier is arranged to receive a reference voltage at the second amplifier input; and
wherein, when the amplifier is enabled, the reference voltage increases until the reference signal substantially reaches a reference voltage threshold level;
the comparator circuit is arranged to compare the first reference voltage to a threshold signal having a voltage that is substantially equal to the reference voltage threshold level, and to provide a comparison output signal based on the comparison; and
wherein the first switch control signal is based, in part, on the comparison output signal.

15. The circuit of claim 14, further comprising a delay circuit that is arranged to provide the first switch control signal from the comparison output signal.

16. A method for audio amplification, comprising:
providing an amplifier output signal based, in part, on a capacitively-coupled audio input signal that is based, in part, on an input RC value; and
adjusting the input RC value such that the input RC value corresponds to a first RC value during a turn-on, the input RC value corresponds to a second RC value after the turn-on, and such that the first RC value is significantly less than the second RC value, wherein the capacitively-coupled audio input signal is capacitively coupled via an input capacitance, and wherein the input capacitance is charged more quickly when the input RC value corresponds to the first RC value than when the input second RC value corresponds to the second value.

17. The method of claim 16, wherein adjusting the input RC value comprises:
closing a switch circuit to provide the input RC value at the first RC value; and
opening the switch circuit to provide the input RC value at the second RC value, wherein the switch circuit is arranged such that a first input resistor is included in the input RC value when the switch circuit is one of open and closed, and wherein the switch circuit is further arranged such that the first input resistor is excluded from the input RC value when the switch circuit is the other of open and closed.

18. The method of claim 16, wherein the second RC value is sufficiently high that low-frequency input audio signals are substantially unattenuated.

19. A method for audio amplification, comprising:
providing an amplifier output signal based, in part, on a capacitively-coupled audio input signal that is based, in part, on an input RC value;
adjusting the input RC value such that the input RC value corresponds to a first value during a turn-on, the input RC value corresponds to a second RC value after the turn-on, and such that the first RC value is significantly less than the second RC value, wherein the second RC value is sufficiently high that low-frequency input audio signals are substantially unattenuated;
opening another switch circuit at an amplification start time such that an amplifier output voltage has a gain relative to the capacitively-coupled audio input voltage when the other switch circuit is open; and
providing a reference voltage to a second amplifier input of the amplifier, wherein adjusting the input RC value is further accomplished such that the first RC value is sufficiently low that the amplifier input voltage and the reference voltage are substantially the same at the amplification start time.

20. An apparatus for audio amplification, comprising:
means for providing an amplifier output signal based, in part, on a capacitively-coupled audio input signal that is based, in part, on an input RC value; and
means for adjusting the input RC value such that the input RC value corresponds to a first RC value during a turn-on, the input RC value corresponds to a second RC value after the turn-on, and such that the first RC value is significantly less than the second RC value, wherein the capacitively-coupled audio input signal is capacitively coupled via an input capacitance, and wherein the input capacitance is charged more quickly when the input RC value corresponds to the first RC value than when the input RC value corresponds to the second RC value.

* * * * *

UNITED STATES PATENT AND TRADEMARK OFFICE
CERTIFICATE OF CORRECTION

PATENT NO. : 7,164,312 B1
APPLICATION NO. : 10/910691
DATED : January 16, 2007
INVENTOR(S) : Raminder Jit Singh et al.

It is certified that error appears in the above-identified patent and that said Letters Patent is hereby corrected as shown below:

Column 6; Line 6; In Claim 16, after "input" delete "second".

Column 6; Line 6; In Claim 16, after "the" delete "second" and insert -- second RC --, therefor.

Signed and Sealed this

Tenth Day of April, 2007

JON W. DUDAS
*Director of the United States Patent and Trademark Office*